United States Patent
Karda et al.

(10) Patent No.: US 9,449,978 B2
(45) Date of Patent: Sep. 20, 2016

(54) SEMICONDUCTOR DEVICES INCLUDING A RECESSED ACCESS DEVICE AND METHODS OF FORMING SAME

(71) Applicant: Micron Technology, Inc., Boise, ID (US)

(72) Inventors: Kamal M. Karda, Boise, ID (US); Mingtao Li, Boise, ID (US); Haitao Liu, Boise, ID (US); Deepak Chandra Pandey, Boise, ID (US); Mark Fischer, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/148,402

(22) Filed: Jan. 6, 2014

(65) Prior Publication Data
US 2015/0194430 A1  Jul. 9, 2015

(51) Int. Cl.
| H01L 27/108 | (2006.01) |
| H01L 27/105 | (2006.01) |
| H01L 29/66 | (2006.01) |
| H01L 29/78 | (2006.01) |

(52) U.S. Cl.
CPC ..... *H01L 27/10879* (2013.01); *H01L 27/1052* (2013.01); *H01L 27/10891* (2013.01); *H01L 29/66613* (2013.01); *H01L 2029/7857* (2013.01)

(58) Field of Classification Search
CPC combination set(s) only.
See application file for complete search history.

(56) References Cited

U.S. PATENT DOCUMENTS

| 6,413,802 | B1 | 7/2002 | Hu et al. | |
| 8,178,862 | B2 | 5/2012 | Colinge | |
| 8,389,364 | B2 | 3/2013 | Lee | |
| 8,435,847 | B2 | 5/2013 | Chun | |
| 2006/0180876 | A1 | 8/2006 | Forbes et al. | |
| 2007/0166920 | A1 | 7/2007 | Tang et al. | |
| 2007/0284628 | A1* | 12/2007 | Kapoor | H01L 29/41775 257/270 |
| 2009/0236657 | A1 | 9/2009 | Ananthan | |
| 2010/0140671 | A1* | 6/2010 | Nojima | H01L 27/10823 257/255 |
| 2010/0276662 | A1 | 11/2010 | Colinge | |
| 2011/0220994 | A1 | 9/2011 | Parekh et al. | |
| 2012/0161208 | A1* | 6/2012 | Veliadis | H01L 29/1608 257/265 |
| 2013/0087853 | A1 | 4/2013 | Kim | |
| 2013/0113029 | A1 | 5/2013 | Chung et al. | |
| 2013/0264631 | A1* | 10/2013 | Alsmeier | H01L 21/28282 257/324 |
| 2013/0285128 | A1 | 10/2013 | Chun | |
| 2014/0299936 | A1* | 10/2014 | Zhang | H01L 27/1211 257/348 |

OTHER PUBLICATIONS

International Search Report for PCT Application No. PCT/US2014/072658, mailed Apr. 20, 2015, 3 pages.
Written Opinion for PCT Application No. PCT/US2014/072658, mailed Apr. 20, 2015, 6 pages.
Taiwan Office Action and Search Report for Taiwan Application No. 104100330 dated Dec. 15, 2015, 10 pages.

* cited by examiner

*Primary Examiner* — Mohammad Islam
*Assistant Examiner* — Ratisha Mehta
(74) *Attorney, Agent, or Firm* — TraskBritt

(57) ABSTRACT

A semiconductor device comprises a recessed access device that includes a first pillar, a second pillar, a channel region connecting the first and second pillars, and a gate disposed over the channel region. The channel region has a width that is narrower than widths of the first pillar and the second pillar. An array of recessed access devices comprises a plurality of pillars protruding from a substrate, and a plurality of channel regions. Each channel region has a width that is less than about 10 nm and couples neighboring pillars to form a plurality of junctionless recessed access devices. A method of forming at least one recessed access device also comprises forming pillars over a substrate, forming at least a channel region coupled with the pillars, the channel region having a relatively narrow width, and forming a gate at least partially surrounding the channel region on at least three sides.

23 Claims, 11 Drawing Sheets

SEMICONDUCTOR DEVICES INCLUDING A RECESSED ACCESS DEVICE AND METHODS OF FORMING SAME

TECHNICAL FIELD

Embodiments disclosed herein relate to semiconductor devices including recess access devices and methods of forming such devices. More specifically, embodiments disclosed herein relate to having relatively narrow channel regions to enable higher doping concentrations in the channel region and maintaining relatively low current leakage.

BACKGROUND

The use of an access device with a storage element in memory cells is well known in the art. An ever-increasing demand for higher-density memory cell arrays has led to the development of vertical memory cell devices, such as recessed access devices (RADs). Vertical memory cell devices may enable higher-density cell arrays by offsetting an access device vertically from a storage element, which arrangement utilizes less horizontal area, termed "real estate," on the array substrate than if the access device were offset horizontally from the storage element.

FIG. 1A is a simplified plan view of a portion of a conventional recessed access device (RAD) 100. FIG. 1B is a cross-section of the conventional recessed access device 100 along line 1B-1B (i.e., taken across each component of the recessed access device 100). FIG. 1C is a cross-section of the conventional recessed access device 100 along line 1C-1C (i.e., taken along gate 130). To assist with the orientation of the different cross-sections, x-, y-, and z-directions are shown for each figure.

The recessed access device 100 includes a first pillar 110 and a second pillar 120 coupled with a channel region 115 therebetween. The first pillar 110 may be a source region, the second pillar 120 may be a drain region, and the channel region 115 may be an active region for the recessed access device 100. The recessed access device 100 may further include a gate 130 that is separated from the first pillar 110, the second pillar 120, and the channel region 115 by a gate oxide 140. The first pillar 110, the channel region 115, and the second pillar 120 of the conventional recessed access device 100 may form PN junctions so that the recessed access device 100 device operates as a transistor. For example, the first pillar 110 may comprise an N-type material, the channel region 115 may comprise a P-type material, and the second pillar 120 may comprise an N-type material to form an NPN transistor.

As shown in FIG. 1B, the recess between the first pillar 110 and the second pillar 120 may form a U-shaped recessed region wherein the gate 130 is formed. FIG. 1B also shows that the recessed access device 100 may be formed on a substrate 105 (e.g., a P-type substrate).

As shown in FIG. 1C, the gate 130 may extend across the channel region 115 and surround the channel region 115 on at least three sides. As discussed above, both the channel region 115 and the substrate 105 comprise a P-type material. As a result, the channel region 115 and the substrate 105 may be formed from the same material. The portion of the gate 130 that extends around the channel region 115 may also be referred to as the "saddle region" because it resembles a saddle being disposed over the channel region 115. Also, the channel region 115 may be referred to as the "fin region" because it resembles a fin extending upward into the saddle region of the gate 130.

If the gate 130 has 0V applied thereto, current should not flow through the channel region 115; however, leakage may occur and current may flow through the channel region 115. Leakage may be reduced by having a relatively low doping concentration for an N-channel region 115; however, performance of the drive current may also be reduced. Performance of the drive current may be improved during operation as the doping concentration of the channel region 115 increases. Therefore, there is a tradeoff between performance during operation when the recessed access device 100 is enabled, and leakage when the recessed access device 100 is disabled depending on the doping concentration selected for the P-type material of the channel region 115.

DETAILED DESCRIPTION

Figure 1A:
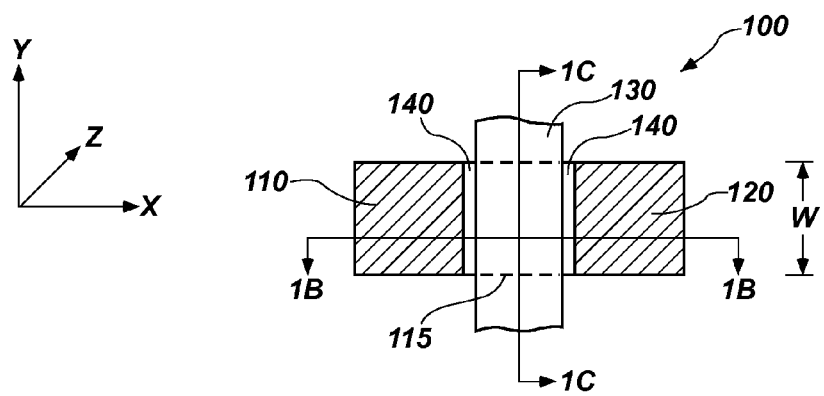
FIGS. 1A-1C are various simplified views of a portion of a conventional recessed access device.
Figure 1B:
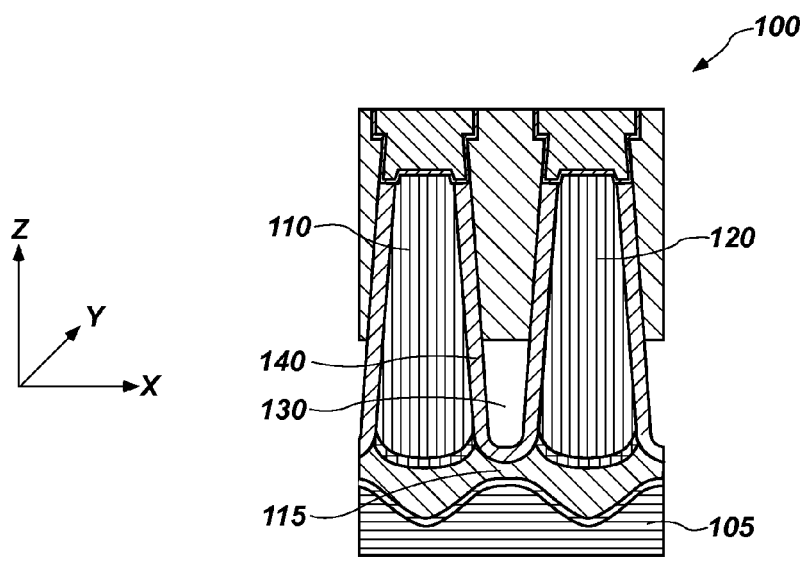
Figure 1C:
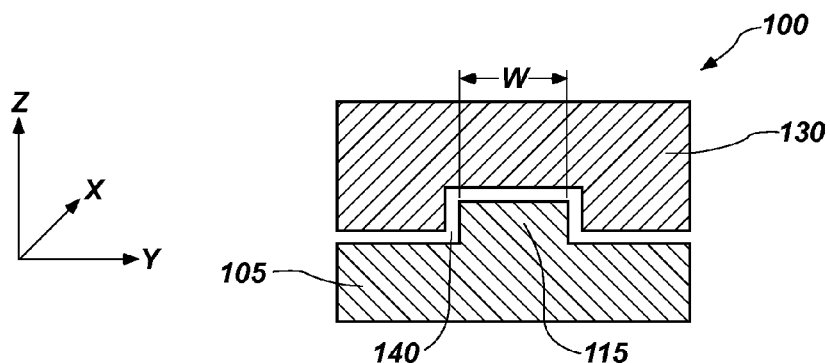

The illustrations included herewith are not meant to be actual views of any particular systems or vertical access devices, but are merely idealized representations that are employed to describe embodiments described herein. Elements and features common between figures may retain the same numerical designation except that, for ease of following the description, for the most part, reference numerals begin with the number of the drawing on which the elements are introduced or most fully discussed.

The following description provides specific details, such as material types and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry.

Embodiments of the present disclosure include a semiconductor device. The semiconductor device comprises a recessed access device, including a first pillar, a second pillar, a channel region connecting the first pillar and the second pillar, and a gate disposed over the channel region. The channel region has a width that is narrower than a width of the first pillar and a width of the second pillar. As a result, the source, drain, and channel region may not have widths that are continuous along the recessed access device.

Figure 2A:
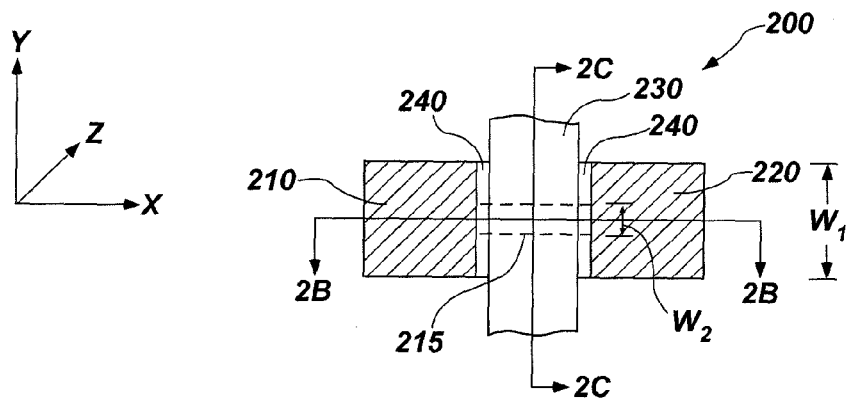
FIGS. 2A-2C are various simplified views of a portion of a recessed access device according to an embodiment of the present disclosure.
Figure 2B:
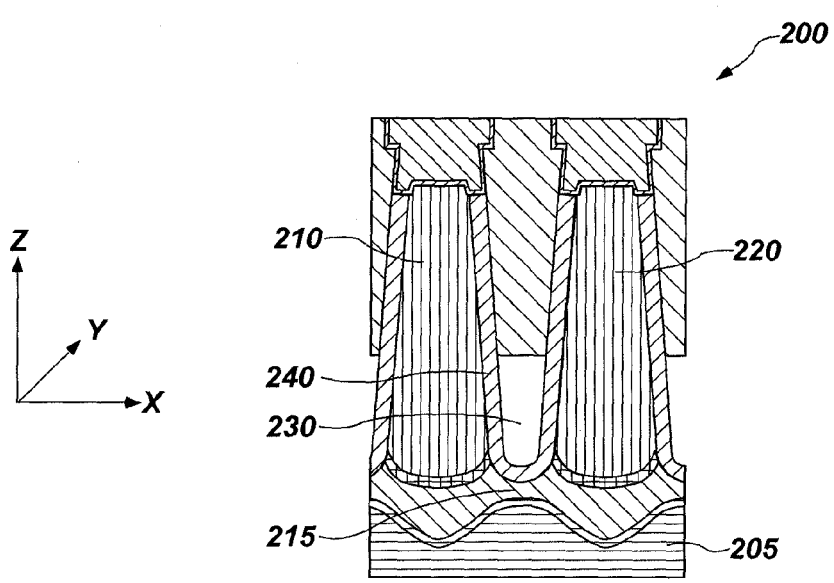
Figure 2C:
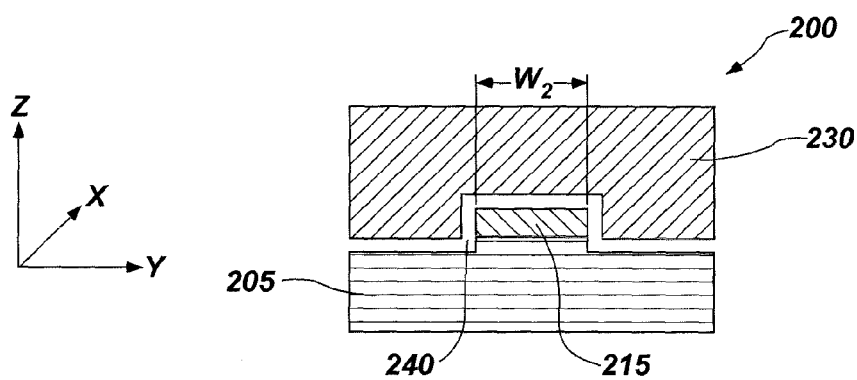

FIG. 2A is a simplified plan view of a recessed access device (RAD) 200 according to an embodiment of the present disclosure. FIG. 2B is a cross-section of the recessed access device 200 along line 2B-2B (i.e., taken across the each component of the recessed access device 200). FIG. 2C is a cross-section of the recessed access device 200 along line 2C-2C (i.e., taken along gate 230). To assist with the orientation of the different cross-sections, x-, y-, and z-directions are shown for each figure.

The recessed access device 200 includes a first pillar 210 and a second pillar 220 coupled with a channel region 215 therebetween. The first pillar 210, the channel region 215, and the second pillar 220 of the recessed access device 200 may operate as a transistor. For example, the first pillar 210 may be a source region, the second pillar 220 may be a drain region, and the channel region 215 may be an active region for the recessed access device 200. The recessed access device 200 may further include a gate 230 that is separated from the first pillar 210, the second pillar 220, and the channel region 215 by a gate oxide 240.

As shown in FIG. 2A, the first pillar 210 and the second pillar 220 may each have a width ($W_1$) (i.e., thickness) that provides one dimension for the area to couple with a contact. For example, in embodiments where the recessed access device 200 is used as an access transistor for a memory cell of a memory array, the first pillar 210 may be coupled to a storage element (e.g., capacitor, spin torque cell, resistive memory element, etc.), and the second pillar 220 may be coupled to a digit line (i.e., bit line). The gate 230 may be coupled to a word line of the memory array. Such a memory array will be discussed further with respect to FIGS. 3A-3C. It is contemplated, however, that the recessed access device 200 may be used in environments other than in memory devices. For example, embodiments of the present disclosure may further include any environment in which a transistor may be needed.

As shown in FIG. 2B, the recess between the first pillar 210 and the second pillar 220 may faint a U-shaped recessed region wherein at least a portion of the gate 230 is disposed. FIG. 2B also shows that the recessed access device 200 may be formed on a substrate 205 (e.g., a P-type semiconductor substrate). FIG. 2B shows the first pillar 210 and the second pillar 220 to have sidewalls that taper slightly; however, other shapes (e.g., straight sidewalls) are contemplated. In some embodiments, the width ($W_1$) of the pillars 210, 220 may be at least substantially uniform.

The substrate 205 may include semiconductor material, including silicon, carbon, germanium, SiGe, SiGeC, a III-V alloy, and a polycrystalline semiconductor material. The substrate 205 may comprise a semiconductor material. By way of non-limiting example, the semiconductor material may include any of silicon, germanium, III-V semiconductor material, and combinations thereof. In some embodiments, the substrate may comprise a semiconductor-on-insulator substrate, such as, by way of non-limiting example, a silicon-on-insulator (SOI) substrate, or a silicon-on-sapphire (SOS) substrate.

As shown in FIG. 2C, the gate 230 may extend across the channel region 215 and at least partially surround the channel region 215 on three sides. The portion of the gate 230 that extends around the channel region 215 may also be referred to as the "saddle region" because it resembles a saddle being disposed over the channel region 215. Also, the portion of the channel region 215 may be referred to as the "fin region" because it resembles a fin extending upward into the saddle region of the gate 230. The channel region 215 may be bound on its lower end to at least be even with, or above, the bottom of the gate 230. In other words, the channel region 215 may not extend below the bottom of the saddle region of the gate 230, which may help ensure isolation between neighboring devices.

FIGS. 2A and 2C show that the channel region 215 has a width ($W_2$) (i.e., thickness). The widths ($W_1$, $W_2$) are defined in these figures as being in a direction (i.e., y-direction) that is orthogonal to the direction (i.e., x-direction) across the components of the recessed access device 200. As discussed above, conventional recessed access devices may experience leakage that occurs when the recessed access device should be disabled (i.e., the gate has 0V applied to it). The narrower the width ($W_2$) of the channel region 215, the more the leakage of the recessed access device 200 may decrease relative to conventional devices. In some embodiments, the width ($W_2$) of the channel region 215 may be about 10 nm or less. The desired width ($W_2$) may depend on the doping concentration used for the channel region 215. In order to have sufficient area for the contacts to be coupled to the pillars 210, 220 while reducing the leakage, the width ($W_2$) of the channel region 215 may be narrow relative to the width ($W_1$) of the pillars 210, 220. As an example, the width ($W_1$) of the pillars 210, 220 may be about 20 nm; however, this dimension may be decreased as limitations for coupling the contacts with the pillars 210, 220 are improved.

In some embodiments, the recessed access device 200 may be junctionless. In other words, the first pillar 210, the channel region 215, and the second pillar 220 may be doped with dopants of the same polarity such that there are no PN junctions between the first pillar 210, the channel region 215, and the second pillar 220. For example, the first pillar 210, the channel region 215, and the second pillar 220 may all be N-type materials. The substrate 205 comprises a P-type material. Thus, in such an embodiment, the channel region 215 and the substrate 205 may be formed from different materials (e.g., materials having different dopants). In other embodiments, the first pillar 210, the channel region 215, and the second pillar 220 may all be P-type materials. In such an embodiment, the substrate 205 may comprise an N-type material.

The first pillar 210, the channel region 215, and the second pillar 220 may have different doping concentrations. For example, the first pillar 210 may be an $N^+$ material, the channel region 215 may be an $N^-$ material, and the second pillar 220 may be an $N^+$ material (i.e., an N+, N−, and N+ device), or in other embodiments, the first pillar 210 may be a $P^+$ material, the channel region 215 may be a $P^-$ material, and the second pillar 220 may be a $P^+$ material (i.e., a $P^+$, $P^-$, and $P^+$ device).

Even though there may not be any PN junctions in the recessed access device 200, the recessed access device 200 may behave like a transistor because the width ($W_2$) of the channel region 215 is narrow in the fin region relative to conventional devices, and the gate 230 at least partially surrounds the channel region 215 on three sides. In general, the smaller the width ($W_2$) of the channel region 215, the stronger the influence (e.g., control) of the channel region 215 by the gate 230. In addition, the lower the doping concentration of the channel region 215, the stronger the influence (e.g., control) of the channel region 215 by the gate 230. Control of the channel region 215 by the gate 230 decreases leakage when the recessed access device 200 is disabled (i.e., turned off). There is a tradeoff, however, in that a higher N-doping concentration (for N-type) or higher P-doping concentration (for P-type) may improve performance of the channel region 215 when the recessed access device 200 is enabled (i.e., turned on). For example, a higher doping concentration may enable more current to flow through the channel region 215 during on-time, which may result in less switching time and a faster device. Therefore, the width ($W_2$) and the doping concentration of the channel region 215 may be selected so that the doping concentration is high and the width ($W_2$) is narrow relative to conventional devices. In some embodiments, the doping in the fin region may be between about 1e17 to 5e19 with a width ($W_2$) that is between about 3 nm and 15 nm. As a result, the recessed access device 200 may achieve a higher drive current (e.g., 10% improvement) in comparison with conventional devices without sacrificing leakage through an increased off-current. For example, in some embodiments, the drive current may be between about 40-60 µA depending on bias conditions.

In some embodiments, the doping concentration of the recessed access device 200 may be relatively uniform throughout the pillars 210, 220. In some embodiments, the doping concentration may be variable, with a higher concentration near the top of the pillars 210, 220 that gradually decreases toward the doping concentration of the channel region 215.

In another embodiment, an array of recessed access devices may comprise a plurality of pillars, and a plurality of channel regions. Each channel region coupling neighboring pillars of the plurality of pillars to form a plurality of junctionless recessed access devices. Each channel region can have a width that is less than about 10 nm.

Figure 3A:
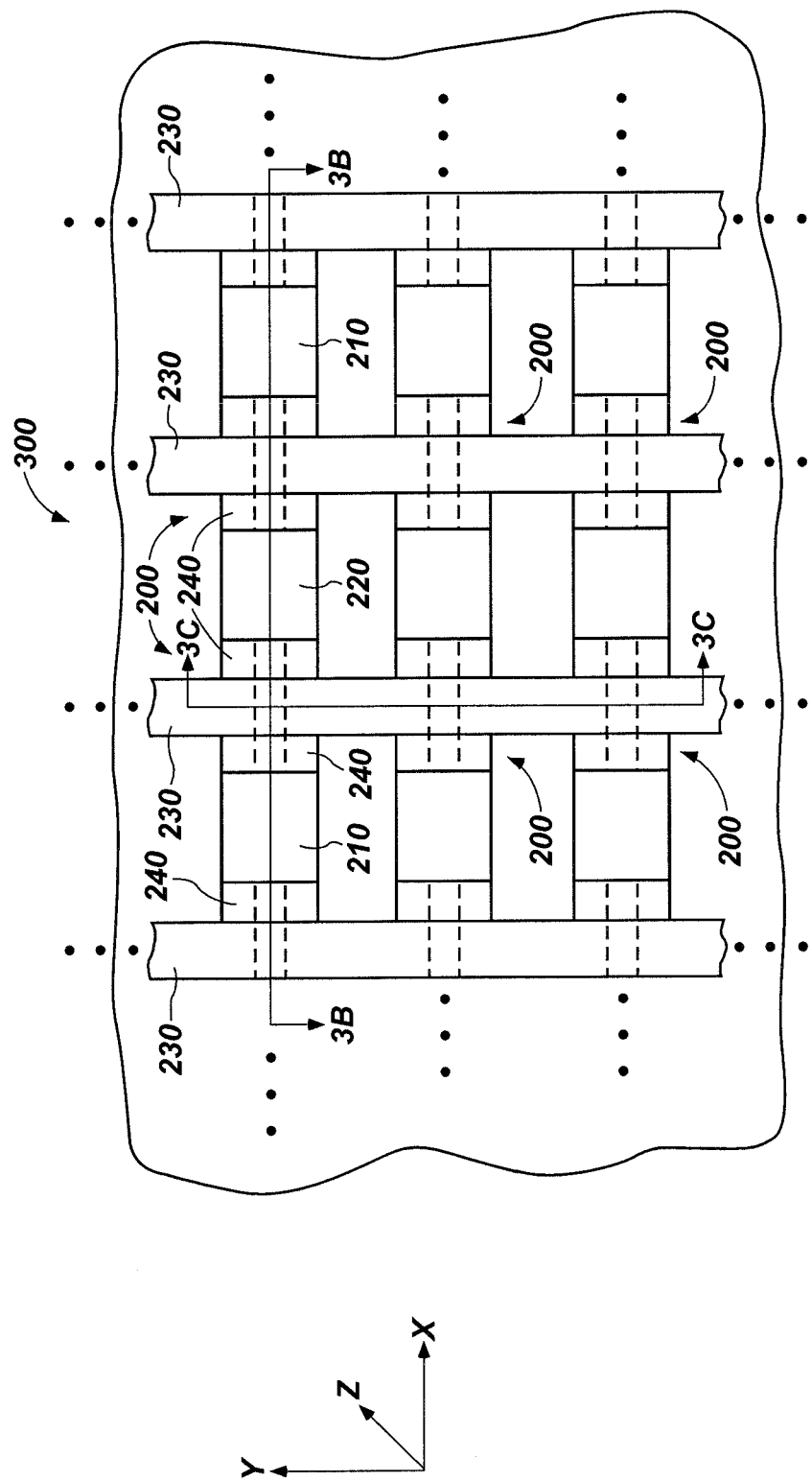
FIGS. 3A-3C are various simplified views of an array of recessed access devices according to an embodiment of the present disclosure.
Figure 3B:
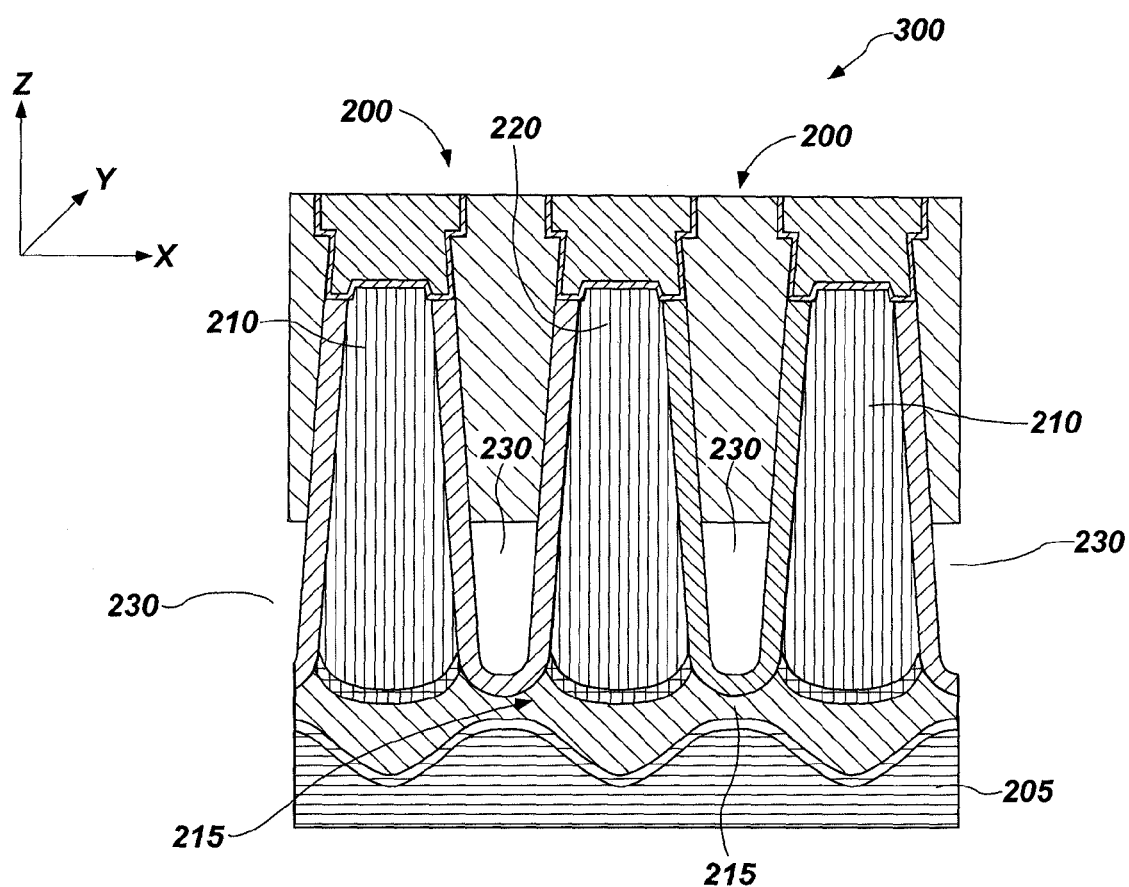
Figure 3C:
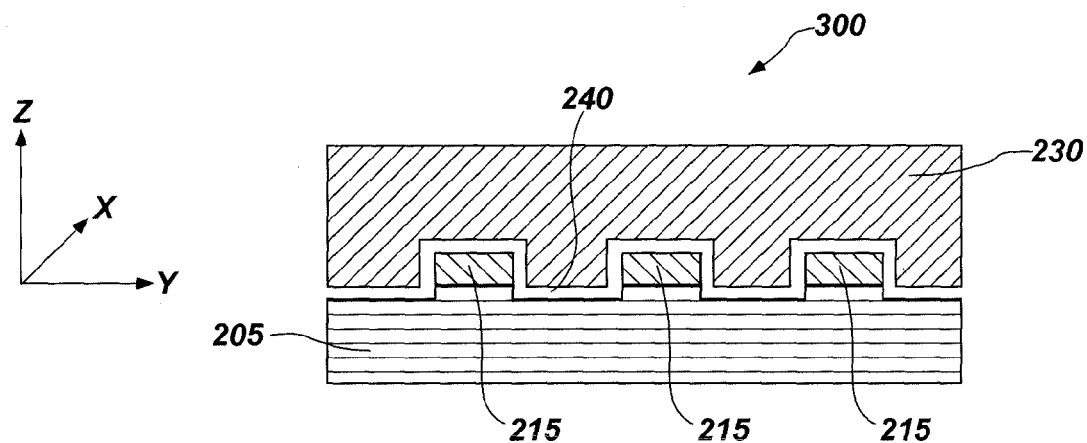

FIG. 3A is simplified top view of an array 300 of recessed access devices 200 according to an embodiment of the present disclosure. Such an array 300 may be implemented in a memory array. FIG. 3B is a cross-section of the array 300 of FIG. 3A along line 3B-3B (i.e., taken across the components of the recessed access device 200). FIG. 3C is a cross-section of the array 300 of FIG. 3A long line 3C-3C (i.e., taken along the gate 230).

Individual recessed access devices 200 may be configured as discussed above with respect to FIGS. 2A-2C. Some pillars 210, 220 may be shared by neighboring recessed access devices 200. For example, for the portion of the array 300 shown in FIGS. 3A and 3B, the second pillars 220 may be shared by neighboring recessed access devices 200. Thus, recessed access devices 200 may be formed with the second pillars 220 and the channel regions 215 with the first pillars 210 on the left side of the second pillars 220. Additional recessed access devices 200 may be formed with the second pillars 220 and the channel regions 215 with the first pillars 210 on the right side of the second pillars 220.

For embodiments that include a memory array, the first pillars 210 may be coupled with a storage element for a memory cell. The second pillars 220 may be coupled with bit lines of the memory array. The gates 230 may be coupled with word lines of the memory array. Examples of memory devices that utilize access devices include dynamic random-access memory (DRAM), resistive random-access memory (RRAM), magnetoresistive random-access memory (MRAM), phase-change random-access memory (PCRAM), and other devices.

Additional embodiments include methods of forming at least one recessed access device. In one embodiment, the method comprises forming at least a first pillar over a substrate, forming at least a second pillar over a substrate, forming at least a channel region coupled with the first pillar and the second pillar, the channel region having a width that is narrower than a width of at least one of the first pillar and the second pillar, and forming a gate within a recess between the first pillar and the second pillar, and at least partially surrounding the channel region on at least three sides.

In another embodiment, a method of forming an array of recessed access devices comprises forming a plurality of trenches in a substrate in a first direction to form a first group of pillars having a first height, and forming another plurality of trenches in the substrate in a second direction to form a second group of pillars having a second height that is less than the first height, wherein forming the another plurality of trenches forms the first group of pillars and the second group of pillars to have at least substantially the same widths, and selectively narrowing the widths of the second group of pillars relative to the widths of the first group of pillars.

FIGS. 4-14 are simplified schematic views of various stages of formation of a recessed access device according to an embodiment of the present disclosure. In the following description, materials are described as being removed, which may include forming trenches, removing materials, shaping materials, etc. Such removal of materials may be performed through methods of photolithography, etching (e.g., wet chemical etching, dry chemical etching, etc.), or other similar methods, or combinations thereof as would be understood by those of ordinary skill in the art. As such, it should be understood that certain steps may not be expressly shown, such as forming a pattern (e.g., mask) used to remove certain materials and not others. Similarly, materials are described below as being formed within a trench, on another material, etc. Such forming of materials may be performed through methods, such as chemical vapor deposition (CVD), physical vapor deposition (PVD), atomic layer deposition (ALD), spin on processing, or other methods (and combinations thereof) that would be understood by those of ordinary skill in the art.

Figure 4:
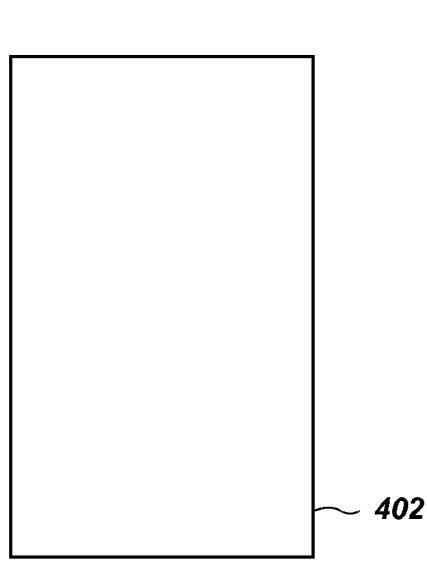
FIGS. 4-14 are simplified schematic views of various stages of formation of a recessed access device according to an embodiment of the present disclosure.
Figure 5A:
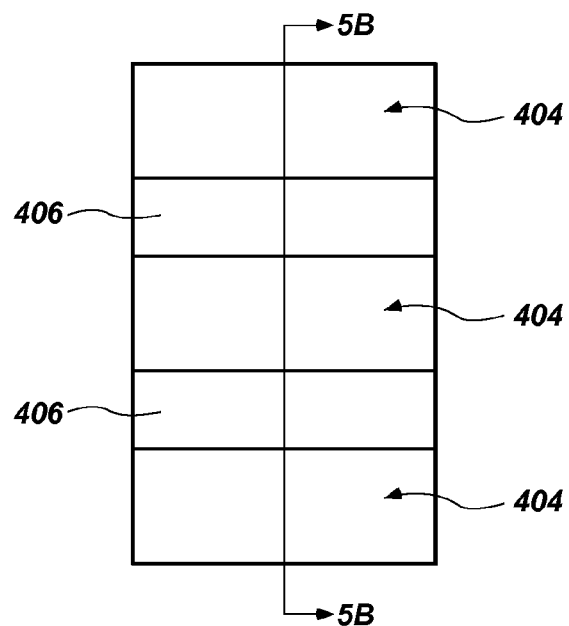
Figure 5B:
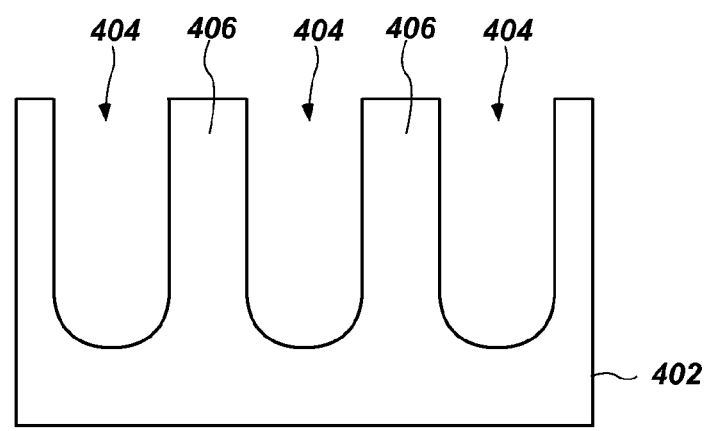

FIG. 4 is a top view of a bulk silicon substrate 402. The bulk silicon substrate 402 may be a continuous substrate having a particular polarity (e.g., N-type or P-type) depending on the desired embodiment. Referring to FIG. 5A, the method may include forming trenches 404 in the bulk silicon substrate 402 such that pillars 406 may protrude from the base of the bulk silicon substrate 402. FIG. 5A is a top view of the resulting structure. At this point in the formation, the pillars 406 may appear as lines protruding from, and extending across the bulk silicon substrate 402. FIG. 5B is a cross sectional side view of the resulting structure of FIG. 5A along the line 5B-5B. FIG. 5B shows the trenches 404 that have been formed to define the pillars 406 in the bulk silicon substrate 402.

Figure 6A:
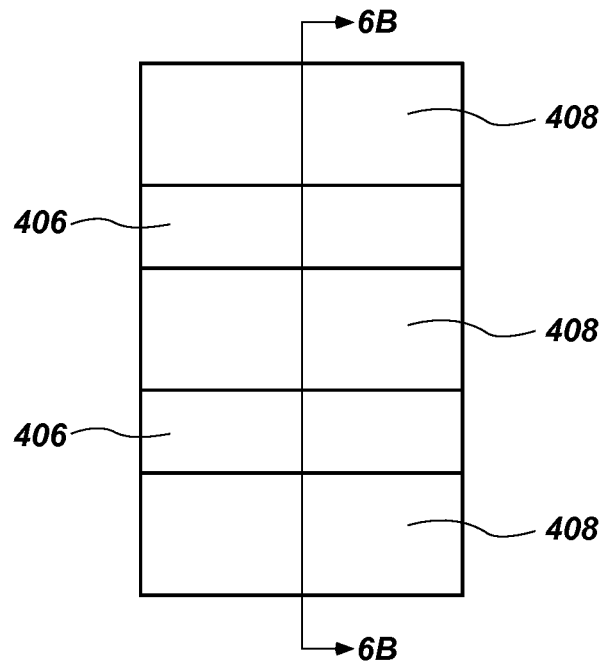
Figure 6B:
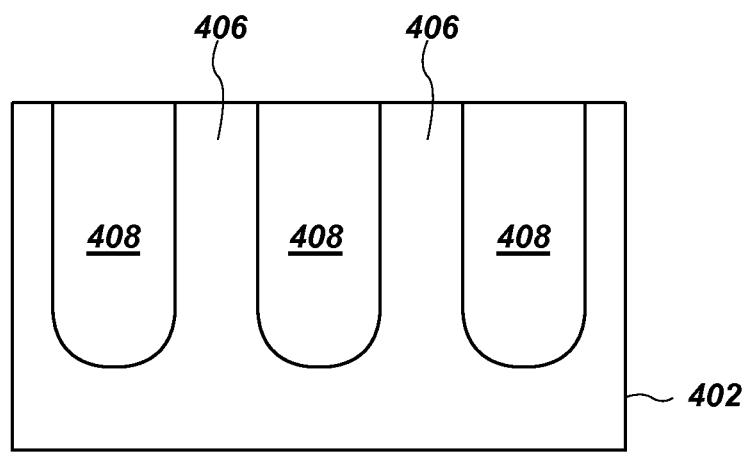

FIG. 6A again shows the top view of the structure at a subsequent stage of formation. As shown by FIG. 6A, a dielectric material 408 (e.g., SiN) may be formed within the trenches 404 (FIG. 5B). As a result, the structure may have alternating lines of pillars 406 and dielectric material 408 when viewed from the top. FIG. 6B is a cross sectional side view of the resulting structure of FIG. 6A along the line 6B-6B.

Figure 7A:
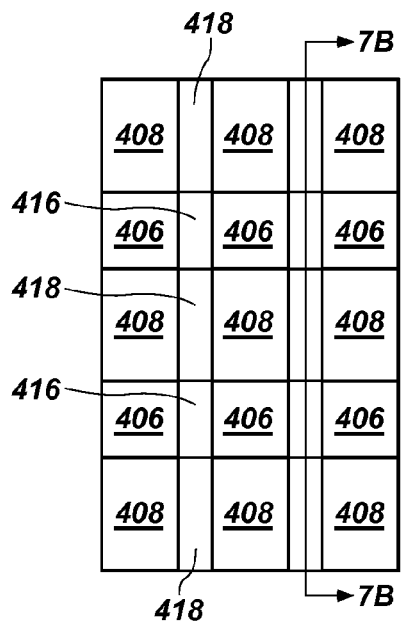

FIG. 7A again shows the top view of the structure at a subsequent stage of formation. As shown by FIG. 7A, the method may further include forming trenches in the structure in a direction that is orthogonal to the direction of the pillars 406 extending across the structure. As a result, a portion of the pillars 406 and the dielectric material 408 may be removed (e.g., via etching). The etching may be deeper within the dielectric material 408 relative to the effect of the etching within the pillars 406. As a result, the remaining portion of the pillars 406 may form a second group of pillars 416 at the intersection of the trenches, wherein the second group of pillars 416 may have a different height than the first group of pillars 406.

Figure 7B:
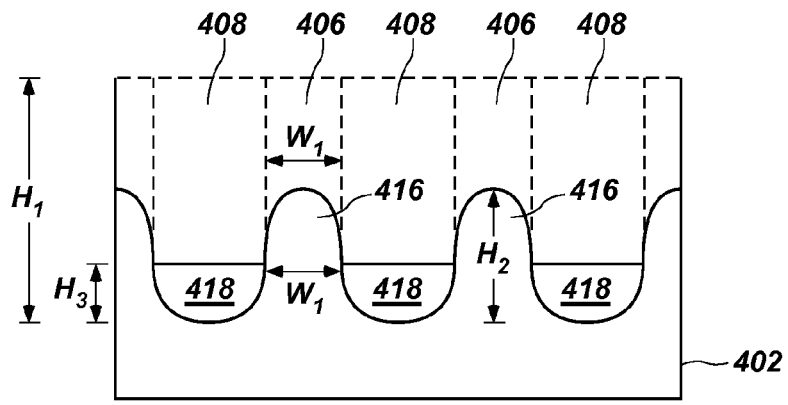

FIG. 7B is a cross-sectional side view of the resulting structure of FIG. 7A along the line 7B-7B. As shown by FIG. 7B, the objects shown in solid lines are a part of the cross-section (i.e., objects that are intersected by line 7B-7B), whereas the objects shown in dashed lines are background objects of the cross-section (i.e., objects that are not intersected by line 7B-7B). Pillars 406, 416 of different heights may be formed through the removal of some of the pillars 406 and dielectric material 408. A first group of pillars 406 of the bulk silicon substrate 402 may have a height ($H_1$) and a second group of pillars 416 of the bulk silicon substrate 402 may have a height ($H_2$). In FIG. 7B, the first group of pillars 406 will correspond to the pillars for the sources and drains of the recessed access device, while the second group of pillars 416 will correspond to the pillars for the channel region (i.e., fin) of the recessed access device. At this point, the pillars 406, 416 of both groups may have substantially the same widths ($W_1$).

Referring still to FIG. 7B, the dielectric material 408 that was not removed during formation of the trenches may also have the same height ($H_1$) as the first group of pillars 406. A dielectric material 418 affected by the formation of the trenches may have a height ($H_3$). The height ($H_3$) of the dielectric material 418 and the height ($H_2$) of the second group of pillars 406 may be different even though the same etching process may have been used during their formation. This difference in height may be achieved through the different characteristics of the different materials. The different heights may also be used to define the saddle region for the gate of the recessed access device that may be formed later in the process.

Figure 8:
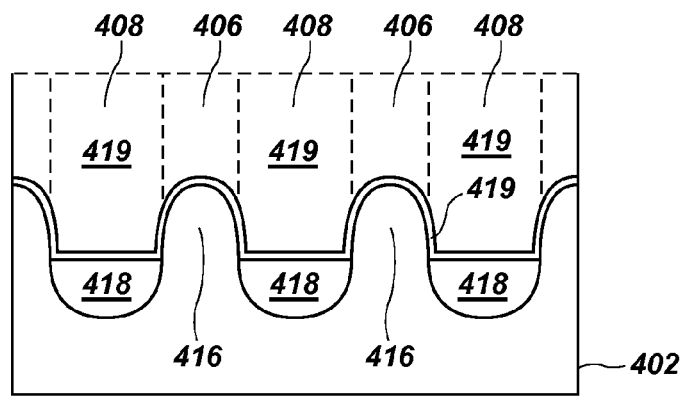

Referring to FIG. 8, a sacrificial material 419 may be formed within the trenches that were formed during the acts of FIG. 7A. The sacrificial material 419 may comprise a dielectric material (e.g., an oxide) that is formed over the second group of pillars 416 and the dielectric material 418. The sacrificial material 419 may also be formed on the sidewalls of the first group of pillars 406 and the dielectric material 408. The sacrificial material 419 may have a relatively uniform thickness on top of the second group of pillars 416 and the sidewalls of the first group of pillars 406. In some embodiments, the sacrificial material 419 may have different thicknesses at different locations.

Figure 9:
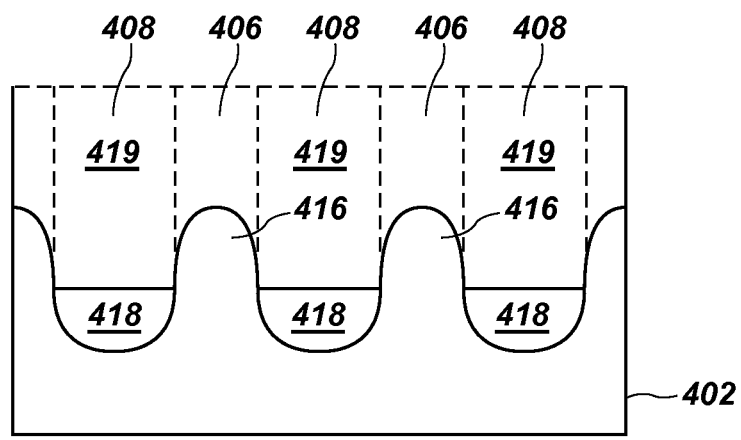

Referring to FIG. 9, a portion of the sacrificial material 419 may be removed (e.g., via etching) from the bottom of the trenches (i.e., from the top of the second group of pillars 416 and dielectric material 418). The portion of the sacrificial material 419 on the sidewalls may remain on the sidewalls as a protection during subsequent processing acts.

Figure 10:
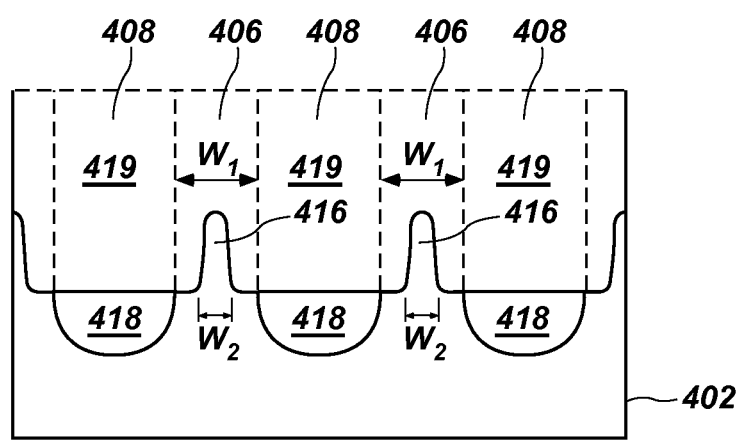

Referring to FIG. 10, a portion of the pillars 416 from the second group of pillars 416 may be removed (e.g., via etching) to narrow the width ($W_2$) of each pillar 416. As a result, the widths ($W_2$) of the pillars 416 of the second group may be narrower than the widths ($W_1$) of the pillars 406 of the first group. The first group of pillars 406 correspond to the first and second pillars 210, 220 discussed above, and the second group of pillars 416 correspond to the fins of the channel region.

Figure 11:
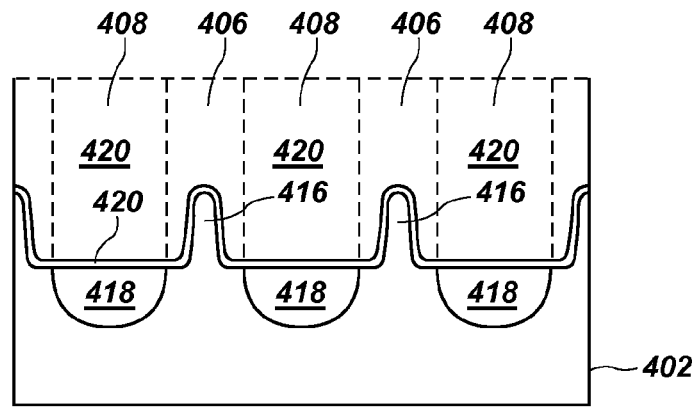

Referring to FIG. 11, the remaining sacrificial material 419 may be removed from the sidewalls of the first group of pillars 406 and the dielectric material 408. In addition, a gate dielectric 420 (e.g., gate oxide) may be formed within the trenches on top of the second group of pillars 416 and the dielectric material 418.

Figure 12:
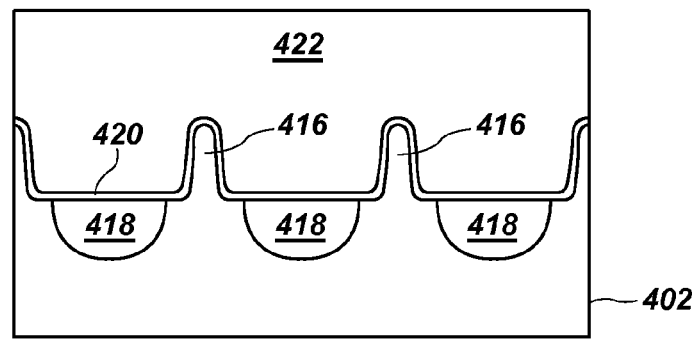
Figure 13:
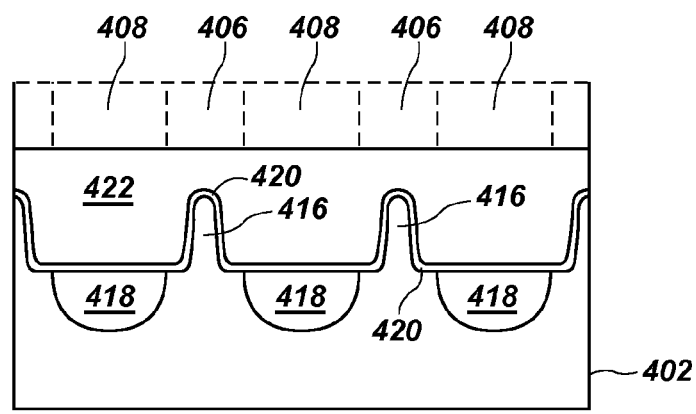
Figure 14:
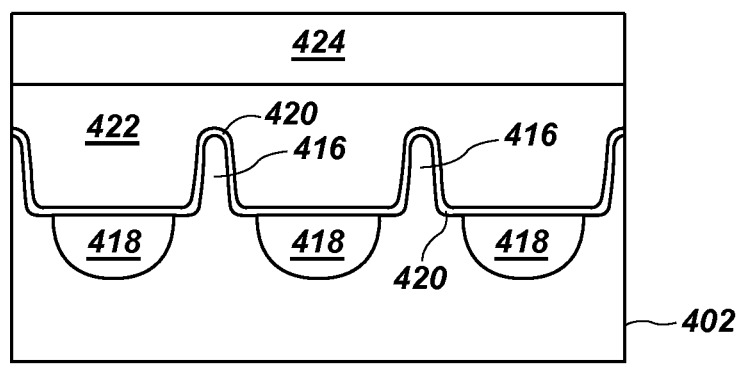

Referring to FIG. 12, a conductive material 422 may be formed within the trenches on top of the gate dielectric 420. Referring to FIG. 13, at least a portion of the conductive material 422 may be removed to farm the conductive material 422 of a desired height for the gate of the recessed access device. As a result, the saddle regions in the conductive material 422 and the relatively narrow fin regions of the channel regions may be formed for the recessed access device. Referring to FIG. 14, another dielectric material 424 may be formed within the remaining area within the trenches on the conductive material 422.

As discussed above, the doping polarity of the pillars (e.g., source and drain) and the channel regions may be the same. In other words, the source, drain, and channel regions may all be N-type materials in one embodiment or all P-type materials in another embodiment. In addition, in some embodiments the relative doping concentrations may not be the same. For example, the channel regions may have relatively lower doping concentrations than the source and the drain regions. In some embodiments, this different doping concentration may occur by doping the first group of pillars 406 and/or the second group of pillars 416 during one or more of the formation steps. In another embodiment, the recessed access device may be formed into a substrate that has multiple doping concentrations (e.g., an $N^-$ material formed on an $N^+$ material) such that implantation during formation of the recessed access device may not be necessary during formation.

Figure 15:
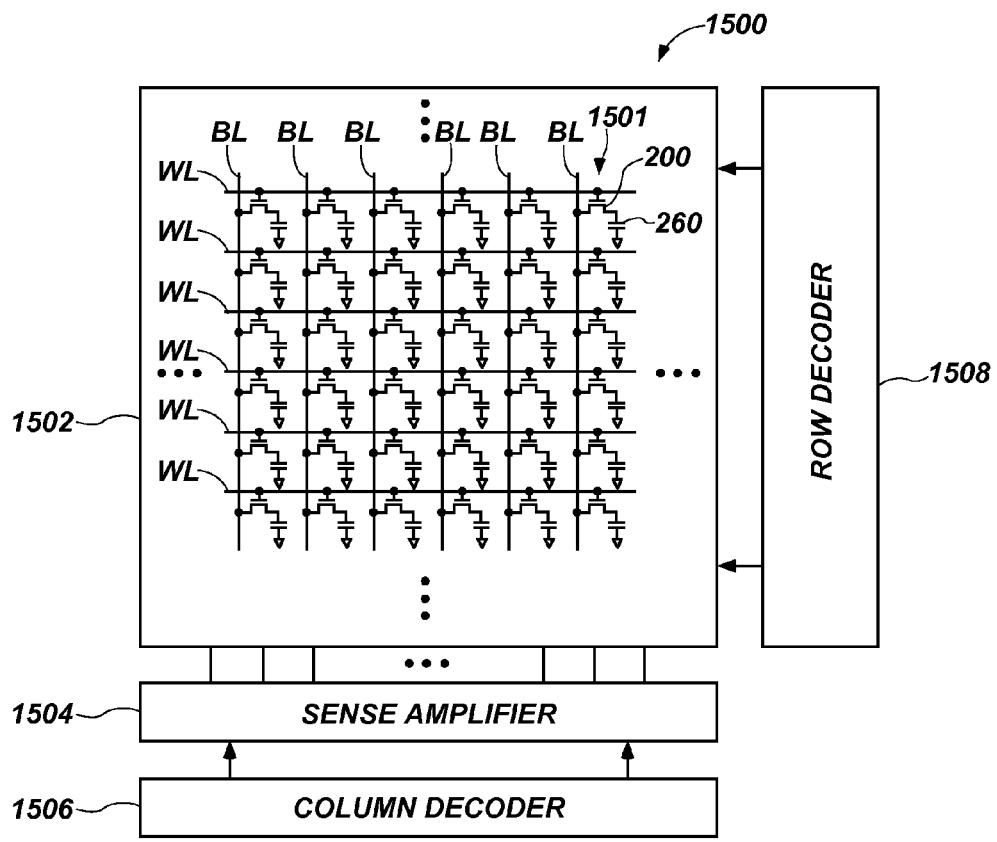
FIG. 15 is a memory cell array including a plurality of recessed access devices according to an embodiment of the present disclosure.

FIG. 15 memory cell array 1500 includes a plurality of recessed access devices 200 according to an embodiment of the present disclosure. The memory cell array 1500 may include an array 1502 of memory cells 1501 that include the recessed access device 200 and a storage element 260 (e.g., shown as capacitor). The array 1502 may be operably coupled to a row decoder 1508, as well as a column decoder 1506 through a sense amplifier block 1504. As discussed above, memory cells and a memory array are examples of an application of the recessed access devices 200, which may be used with any application in need of such a transistor.

Figure 16:
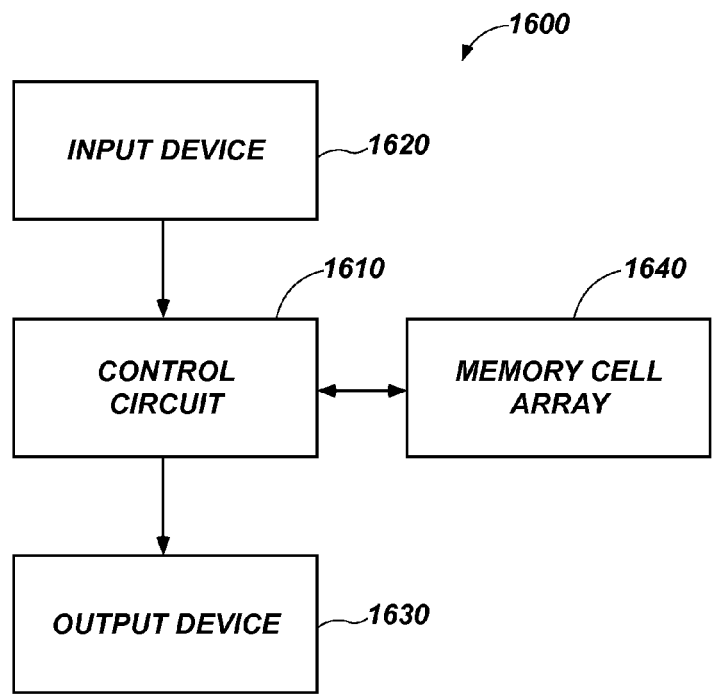
FIG. 16 is a simplified block diagram of an electrical system.

FIG. 16 is a simplified block diagram of an electrical system 1600. The electrical system 1600 may include a memory cell array 1640, a control circuit 1610, an input device 1620, and an output device 1630 that are operably coupled to communicate with each other through the control circuit 1610. The memory cell array 1640 may be configured similarly as the memory cell array 1500 of FIG. 15, and may include one or more recessed access devices 200. In general, the memory cell array 1640 may include any combination of features described herein, and/or their equivalents.

The control circuit 1610 may be configured to control the memory cell array 1640. The control circuit 1610 may include one or more devices from the group consisting of a processor, a hard disk drive, and an optical disc drive (not shown). The control circuit 1610 may also be configured to apply one or more of a plurality of voltages to the digit lines DL and the word lines WL of the memory cell array 1640. The control circuit 1610 may be further configured to perform read, write, refresh, and other operations on the memory cell array 1640.

The control circuit 1610 may also be operably coupled to the input device 1620, and the output device 1630. By way of non-limiting example, the input device 1620 may include any of a keyboard, a button array, a mouse device, a touch screen input, other similar devices, and combinations thereof. The control circuit 1610 may be configured to receive and execute commands, and receive information, from the input device 1620.

The output device 1630 may include, by way of non-limiting example, any of a liquid crystal display (LCD) device, a light-emitting diode (LED) array, a cathode ray tube (CRT) display, a sound generating device, an electrical signal output port, other similar devices, and combinations thereof. The control circuit 1610 may be configured to cause the output device 1630 to communicate information to a user (not shown) or another device (not shown).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure as contemplated by the inventors.

What is claimed is:

1. A semiconductor device, comprising:
a recessed access device, including:
    a first pillar protruding from a substrate;
    a second pillar protruding from the substrate;
    a channel region including a fin structure, the channel region extending in a first direction between the first pillar and the second pillar and connecting the first pillar and the second pillar, wherein the channel region has a width in a second direction that is orthogonal to the first direction that is narrower than a width of the first pillar and a width of the second pillar in the second direction; and
    a gate disposed over the channel region, the gate including a saddle region at least partially surrounding the fin structure on three sides thereof, a lower portion of the channel region located above a lower portion of the gate.

2. The semiconductor device of claim 1, wherein the first pillar, the second pillar, and the channel region are each formed from an N-type material and the substrate is formed from a P-type material.

3. The semiconductor device of claim 2, wherein the first pillar and the second pillar are each formed from an N⁺ semiconductor material, and the channel region is formed from an N⁻ semiconductor material.

4. The semiconductor device of claim 1, wherein the first pillar, the second pillar, and the channel region are each formed from a P-type material.

5. The semiconductor device of claim 4, wherein the first pillar and the second pillar are each formed from a P⁺ semiconductor material, and the channel region is formed from a P⁻ semiconductor material.

6. The semiconductor device of claim 1, wherein the width of the channel region is less than 10 nm.

7. The semiconductor device of claim 1, wherein the first pillar and the second pillar have a higher doping concentration than a doping concentration of the channel region.

8. The semiconductor device of claim 1, wherein each of the first pillar and the second pillar comprises a higher doping concentration at a top portion thereof than proximate the channel region.

9. The semiconductor device of claim 1, wherein the first pillar comprises a source region, the second pillar comprises a drain region, and the channel region comprises an active region.

10. The semiconductor device of claim 1, wherein the first pillar and the second pillar each comprise tapered sidewalls.

11. A semiconductor device, comprising:
at least a first pillar comprising a source region over a substrate;
at least a second pillar comprising a drain region laterally adjacent to the at least a first pillar;
a channel region extending from the at least a first pillar to the at least a second pillar in a first direction;
a gate between the at least a first pillar and the at least a second pillar;
a gate oxide between the gate and each of the at least a first pillar and the at least a second pillar; and
a word line connecting the gate to other gates between other pillars, the word line extending in a second direction that is orthogonal to the first direction.

12. The semiconductor device of claim 11, wherein the at least a first pillar has a height that is greater than a height of the at least a second pillar.

13. The semiconductor device of claim 11, wherein the at least a first pillar is coupled with a storage element of a memory cell and the at least a second pillar is coupled to a bit line of a memory array.

14. A semiconductor device, comprising:
a recessed access device, including:
    a first pillar protruding from a substrate;
    a second pillar protruding from the substrate;
    a channel region extending in a first direction between the first pillar and the second pillar and connecting the first pillar and the second pillar, wherein the channel region has a width in a second direction that is orthogonal to the first direction that is narrower than a width of the first pillar and a width of the second pillar in the second direction; and
    a gate disposed over the channel region;
a plurality of additional pillars protruding from the substrate; and
a plurality of channel regions, each channel region coupling neighboring pillars of the plurality of additional pillars to form an array of junctionless recessed access devices, wherein each channel region has a width that is less than about 10 nm.

15. The semiconductor device of claim 14, wherein the array of junctionless recessed access device comprises the plurality of additional pillars and the plurality of channel regions all being N-type materials without a PN junction therebetween.

16. The semiconductor device of claim 14, wherein the array of junctionless recessed access device comprises the plurality of additional pillars and the plurality of channel regions all being P-type materials without a PN junction therebetween.

17. The semiconductor device of claim 14, wherein each channel region of the plurality of channel regions has a doping concentration that is relatively lower than a doping concentration of the pillars of the plurality of additional pillars.

18. The semiconductor device of claim 14, further comprising a plurality of gates that extend along the array of junctionless recessed access devices over the plurality of channel regions.

19. The semiconductor device of claim 18, wherein the plurality of gates includes a plurality of word lines of a memory array, each word line of the plurality of word lines extending in the orthogonal direction.

20. The semiconductor device of claim 14, wherein at least one pillar of the plurality of additional pillars is shared by at least two neighboring junctionless recessed access devices of the array.

21. A method of forming at least one recessed access device, the method comprising:

forming at least a first pillar over a substrate;
forming at least a second pillar over the substrate;
forming at least a channel region including a fin structure and extending in a first direction between the at least a first pillar and the at least a second pillar coupled with the at least a first pillar and the at least a second pillar, the channel region having a width in a second direction that is orthogonal to the first direction that is narrower than a width of the at least a first pillar and a width of the at least a second pillar in the second direction; and
forming a gate within a recess between the first pillar and the second pillar, and including a saddle region at least partially surrounding the channel region on at least three sides, forming the gate within the recess comprising forming the gate such that a lower portion of the channel region is located above a lower portion of the gate.

22. The method of claim 21, wherein forming at least a first pillar and forming at least a second pillar comprise:
forming a plurality of trenches in the first direction in a substrate;
forming a dielectric material within the trenches; and
forming another plurality of trenches in the substrate and the dielectric material in the second direction.

23. The method of claim 22, wherein forming at least a channel region includes removing at least a portion of the pillars of at least another pillar to a desired width of the channel region, the at least another pillar located at an intersection of a first trench of the plurality of trenches and another trench of the another plurality of trenches.

* * * * *

UNITED STATES PATENT AND TRADEMARK OFFICE
CERTIFICATE OF CORRECTION

PATENT NO. : 9,449,978 B2
APPLICATION NO. : 14/148402
DATED : September 20, 2016
INVENTOR(S) : Kamal M. Karda et al.

It is certified that error appears in the above-identified patent and that said Letters Patent is hereby corrected as shown below:

In the specification:
    COLUMN 3,   LINE 34,     change "may faint a" to --may form a--
    COLUMN 7,   LINE 64,     change "removed to farm the" to --removed to form the--

Signed and Sealed this
Eighth Day of November, 2016

Michelle K. Lee
*Director of the United States Patent and Trademark Office*